(12) United States Patent
Mizugaki

(10) Patent No.: US 11,404,626 B2
(45) Date of Patent: Aug. 2, 2022

(54) VIBRATOR DEVICE, METHOD OF MANUFACTURING VIBRATOR DEVICE, ELECTRONIC APPARATUS, AND VEHICLE

(71) Applicant: SEIKO EPSON CORPORATION, Tokyo (JP)

(72) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 426 days.

(21) Appl. No.: 16/542,100

(22) Filed: Aug. 15, 2019

(65) Prior Publication Data

US 2020/0058843 A1 Feb. 20, 2020

(30) Foreign Application Priority Data

Aug. 17, 2018 (JP) .............................. JP2018-153515

(51) Int. Cl.
 H01L 41/09 (2006.01)
 H02P 29/60 (2016.01)
 H03H 9/19 (2006.01)
 H03H 3/02 (2006.01)
 G01P 15/097 (2006.01)

(52) U.S. Cl.
 CPC .............. *H01L 41/09* (2013.01); *H02P 29/60* (2016.02); *H03H 9/19* (2013.01); *G01P 15/097* (2013.01); *H03H 2003/022* (2013.01)

(58) Field of Classification Search
 CPC .... H01L 41/09; H03H 9/19; H03H 2003/022; H03H 2003/0519; H03H 2003/0509; H02P 29/60; G01P 15/097
 See application file for complete search history.

(56) References Cited

U.S. PATENT DOCUMENTS

| | | | |
|---|---|---|---|
| 2009/0066190 A1* | 3/2009 | Harima | H03H 9/1035 310/348 |
| 2011/0163637 A1* | 7/2011 | Hashi | H03H 9/21 310/344 |
| 2014/0368089 A1* | 12/2014 | Omomo | H03H 9/0519 310/348 |
| 2016/0164490 A1* | 6/2016 | Kamijo | H03H 3/02 310/348 |
| 2019/0199315 A1* | 6/2019 | Murakami | H03B 5/04 |
| 2019/0212145 A1* | 7/2019 | Kiya | H03H 9/1021 |
| 2020/0382095 A1* | 12/2020 | Kamakura | H03H 3/02 |

FOREIGN PATENT DOCUMENTS

| | | |
|---|---|---|
| JP | H05121985 | 5/1993 |
| JP | H08288775 A * | 11/1996 |
| JP | 11097564 | 4/1999 |
| JP | 3379285 B2 * | 2/2003 |
| JP | 2004128591 | 4/2004 |
| JP | 2008-193175 | 8/2008 |
| JP | 2017139717 | 8/2017 |

* cited by examiner

*Primary Examiner* — J. San Martin
(74) *Attorney, Agent, or Firm* — Workman Nydegger

(57) ABSTRACT

A vibrator device including a vibrator element, an IC substrate including a semiconductor substrate configured of a semiconductor having a first conductive type and a circuit electrically coupled to the vibrator element, the first conductive type being any one of an N-type and a P-type, and a lid directly bonded to the semiconductor substrate and configured of a semiconductor having the first conductive type.

12 Claims, 11 Drawing Sheets

VIBRATOR DEVICE, METHOD OF MANUFACTURING VIBRATOR DEVICE, ELECTRONIC APPARATUS, AND VEHICLE The present application is based on, and claims priority from JP Application Serial Number 2018-153515, filed Aug. 17, 2018, the disclosure of which is hereby incorporated by reference herein in its entirety.

BACKGROUND

1. Technical Field

The present disclosure relates to a vibrator device, a method of manufacturing the vibrator device, an electronic apparatus, and a vehicle.

2. Related Art

An oscillator using a crystal unit is known and is widely used as a reference frequency source and an oscillation source of various electronic apparatuses.

Such an oscillator includes an oscillator circuit that oscillates a crystal unit, an output circuit that converts an output frequency from the oscillator circuit into a predetermined output format and outputs it, a control circuit that controls the operation of the oscillator circuit and the output circuit, and the like. It is possible to output a clock signal of a desired frequency from the output circuit by combining these circuits.

For example, JP-A-2017-139717 discloses a piezoelectric oscillator including a first substrate made of silicon, a second substrate (lid substrate) made of silicon, a circuit for operating the oscillator, and a crystal unit. Moreover, an active layer which constitutes the circuit is formed in the first substrate, and the first substrate and the second substrate are bonded through a bonding material such as gold or an adhesive. The crystal unit is housed in an airtight cavity formed by the first substrate and the second substrate.

Further, JP-A-2004-128591 discloses a piezoelectric oscillator in which a piezoelectric vibrator is directly mounted on and coupled to a semiconductor integrated component and the piezoelectric vibrator is covered with a lid from above the semiconductor integrated component.

In any of above oscillators described in JP-A-2017-139717 and JP-A-2004-128591, the quartz vibrator element is housed in the cavity, so that the quartz vibrator element can be protected from the external environments, and the like.

However, in the oscillators disclosed in JP-A-2017-139717 and JP-A-2004-128591, there is a risk that electromagnetic noise that enters from the outside may be superimposed on electrodes, wirings, and the like coupled to the vibrator element. When such superposition of electromagnetic noise occurs, defects such as abnormal oscillation and deterioration of quality of output signal occur. Therefore, there is a need for means for suppressing the occurrence of a defect due to electromagnetic noise in the oscillator.

SUMMARY

A vibrator device according to an aspect of the present disclosure includes a vibrator element, an IC substrate including a semiconductor substrate configured of a first conductive type semiconductor and a circuit electrically coupled to the vibrator element, the first conductive type being any one of an N-type and a P-type, and a lid which is directly bonded to the semiconductor substrate and is configured of the first conductive type semiconductor.

DESCRIPTION OF EXEMPLARY EMBODIMENTS

Preferred embodiments of a vibrator device, a method of manufacturing the vibrator device, an electronic apparatus, and a vehicle according to the present disclosure will be described in detail below based on the attached drawings.

Vibrator Device

First Embodiment

First, a first embodiment of the vibrator device will be described.

Figure 1:
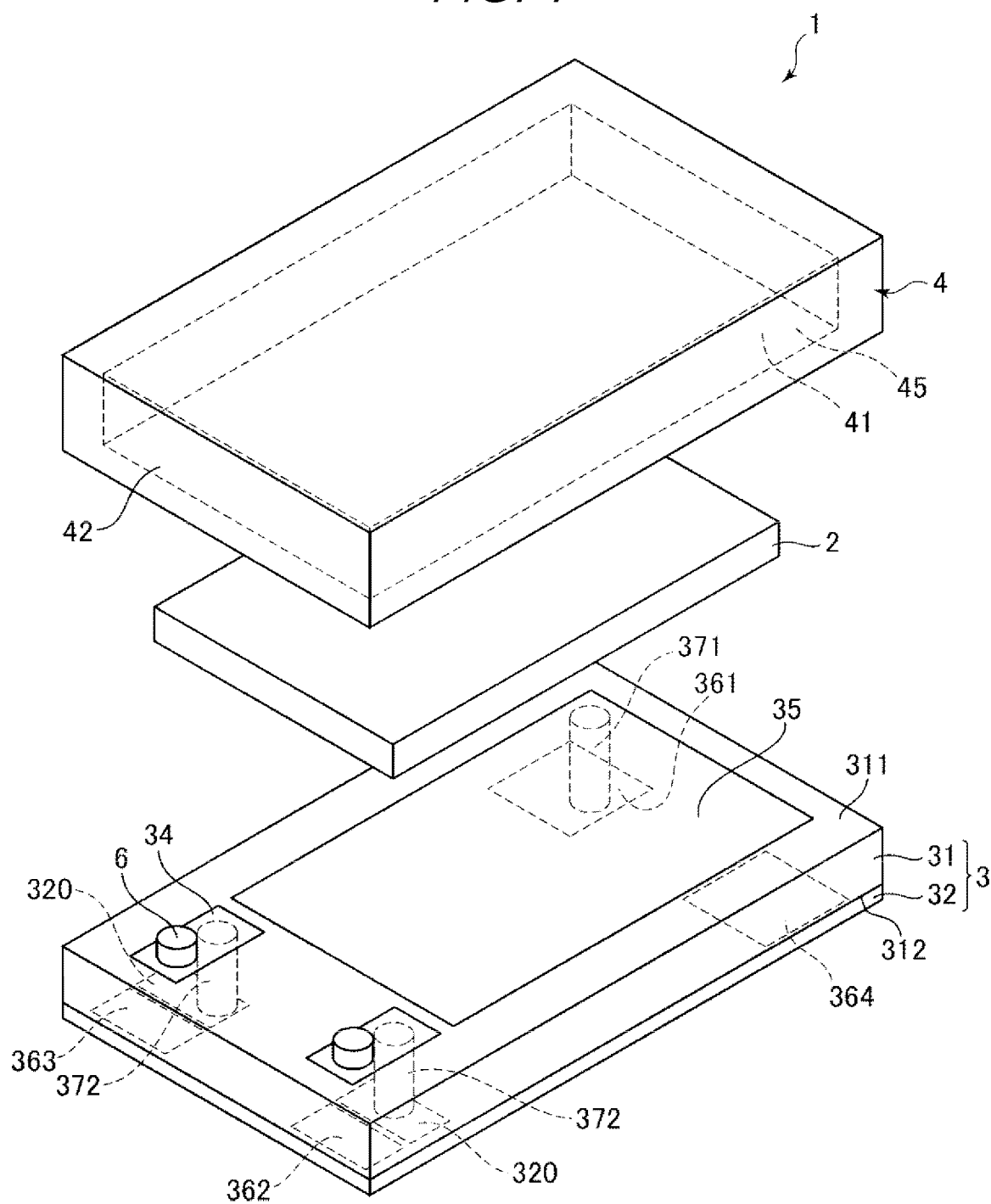
FIG. 1 is an exploded perspective view showing a vibrator device according to a first embodiment.
Figure 2:
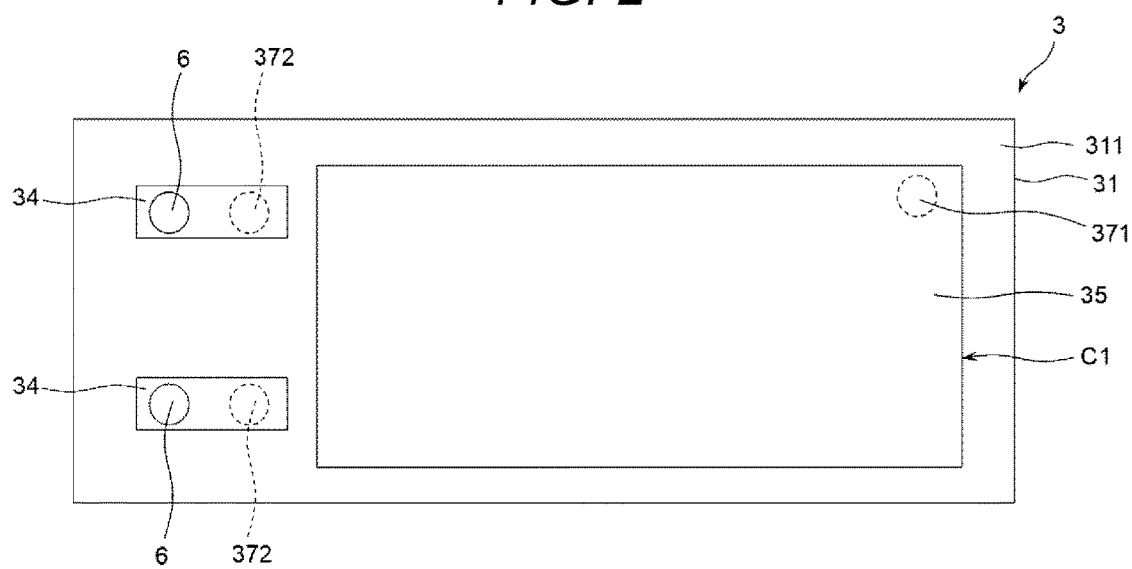
FIG. 2 is a plan view showing an integrated circuit (IC) substrate provided in the vibrator device shown in FIG. 1.

FIG. 1 is an exploded perspective view showing a first embodiment of a vibrator device of the present disclosure. FIG. 2 is a plan view showing an integrated circuit (IC) substrate provided in the vibrator device shown in FIG. 11.

Figure 3:
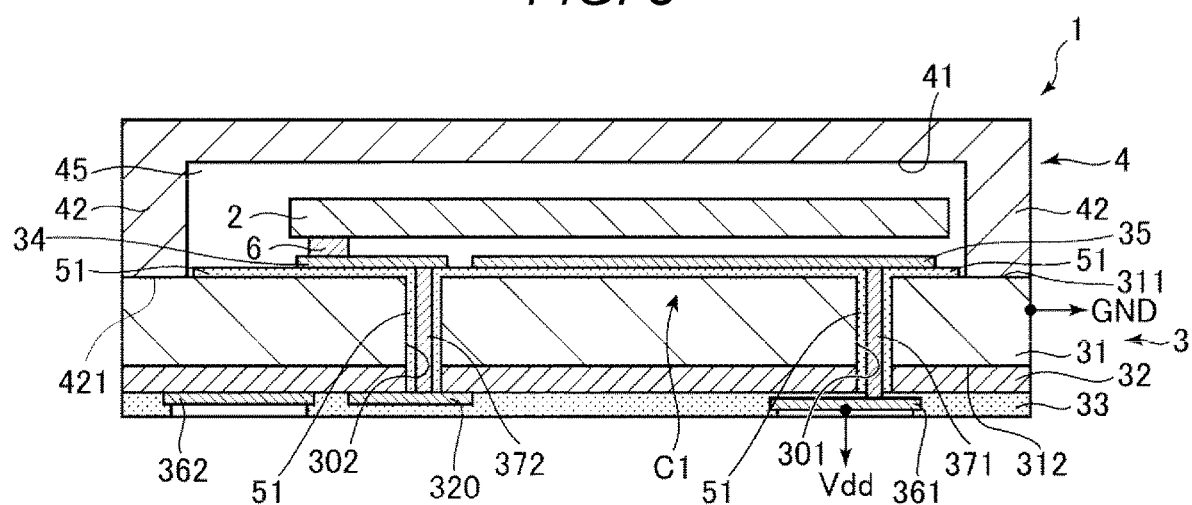
FIG. 3 is a sectional view of the vibrator device shown in FIG. 1.
Figure 4:
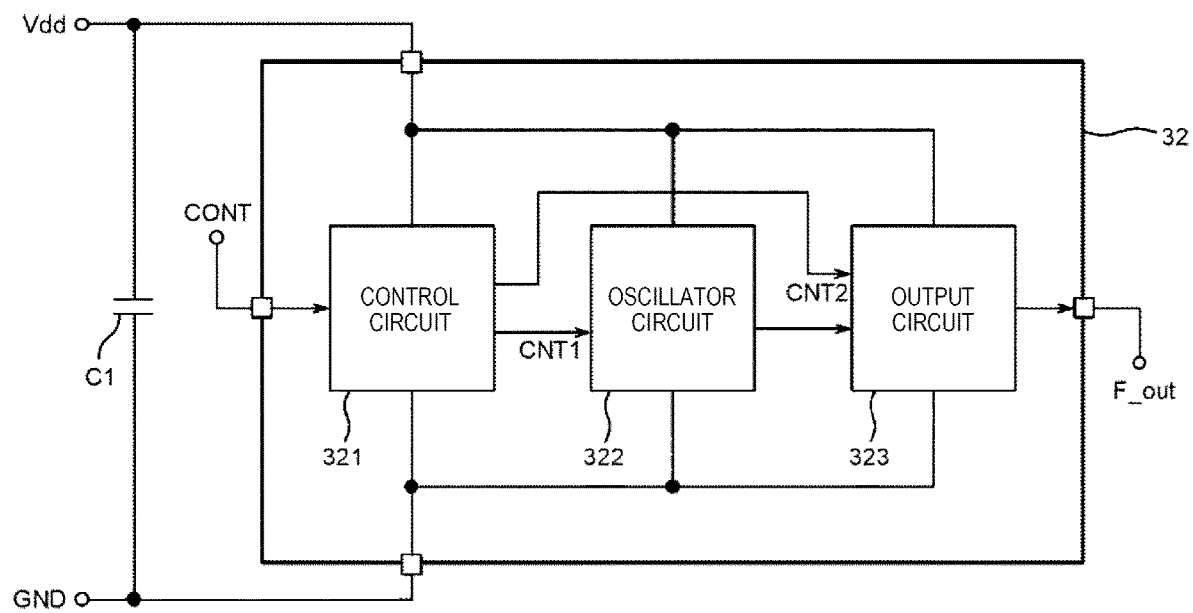
FIG. 4 is a block diagram showing a circuit formed of the IC substrate shown in FIG. 2.
Figure 5:
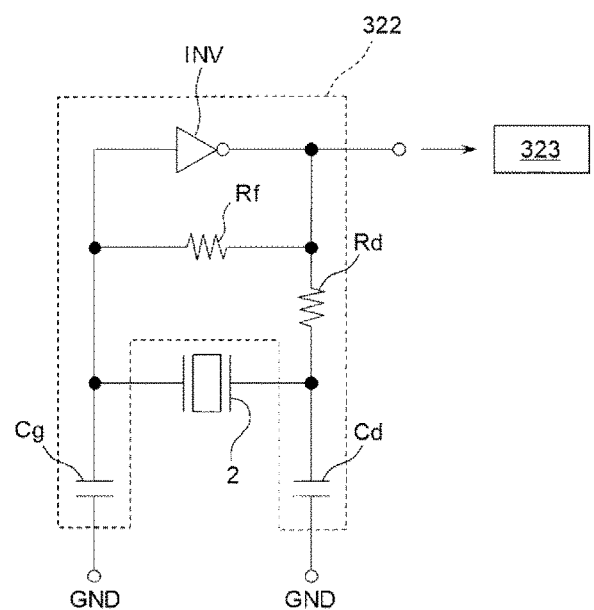
FIG. 5 is a circuit diagram showing a part of the circuit shown in FIG. 4.

FIG. 3 is a sectional view of the vibrator device shown in FIG. 1. FIG. 4 is a block diagram showing a circuit formed of the IC substrate shown in FIG. 2. FIG. 5 is a circuit diagram showing a part of the circuit shown in FIG. 4.

A vibrator device 1 shown in FIG. 1 is an oscillator including a vibrator element 2, an IC substrate 3, and a lid 4. Among these, the IC substrate 3 includes a semiconductor substrate 31 and a circuit 32. The semiconductor substrate 31 and the lid 4 are directly bonded to each other, and an airtight cavity 45 is formed therebetween. The vibrator element 2 is housed in the cavity 45.

Hereinafter, the vibrator device 1 will be described in more detail.

The vibrator element 2 includes a quartz crystal plate which is cut at a cut angle called AT cut. The AT cut is cutting a main surface obtained by rotating a plane (Y plane) including an X axis and a Z axis, which are axes of quartz crystal, from Z axis by substantially 15 minutes at substantially 35 degrees counterclockwise around the X axis. The main surface of the vibrator element 2 is in a form of a rectangle having a major axis parallel to the X axis.

The cut angle of the quartz crystal plate provided in the vibrator element 2 is not limited to the AT cut, and may be a Z cut, BT cut, or the like. Moreover, the shape of the main surface of the vibrator element 2 is not limited to a rectangular shape, and may be a shape such as two-legged tuning fork, an H-shaped tuning fork, a three-legged tuning fork, a comb teeth shape, an orthogonal shape, or a prism shape. Furthermore, the vibrator element 2 may be a surface acoustic wave (SAW) vibrator element, a micro electro mechanical systems (MEMS) vibrator element, a vibrator element for an acceleration sensor, a vibrator element for an angular velocity sensor, or the like.

Therefore, examples of the vibrator device 1 include various types of oscillators such as a simple packaged crystal oscillator (SPXO), a voltage controlled crystal oscillator (VCXO), a temperature compensated crystal oscillator (TCXO), an oven controlled crystal oscillator (OCXO), a voltage controlled SAW oscillator (VCSO), a SAW oscillator (SPSO), and an MEMS oscillator, inertial sensors such as an acceleration sensor and an angular velocity sensor, force sensors such as a tilt sensor, and the like.

As described above, the IC substrate 3 includes the semiconductor substrate 31 and the circuit 32.

The semiconductor substrate 31 is configured of a P-type semiconductor which is a P-type semiconductor of the conductivity type, and has conductivity. Such a semiconductor substrate 31 is used as a base substrate for supporting the vibrator element 2 and forming the circuit 32.

Examples of main materials of the semiconductor substrate 31 include various semiconductor materials such as silicon, germanium, silicon oxide, gallium nitride, indium gallium arsenide, and the like. Among these, the semiconductor substrate 31 is preferably made of silicon. Silicon is easy to obtain and process as a semiconductor material and is inexpensive.

The semiconductor substrate 31 is preferably a crystalline substrate, and more preferably a single crystal substrate. Accordingly, in the direct bonding between the semiconductor substrate 31 and the lid 4, more airtight bonding can be performed at a lower temperature. At the same time, the circuit 32 can be easily formed at a part of the single crystal substrate.

In the present specification, the two main surfaces of the semiconductor substrate 31 in the relation of the front and back and side surfaces connecting the main surfaces are collectively referred to as a surface. Between the two main surfaces, the main surface at which the circuit 32 is provided is referred to as a "second surface 312", and the main surface at the opposite side is referred to as a "first surface 311". Moreover, the shape of the main surface is not particularly limited, and examples thereof include a square, an oval, and the like.

The circuit 32 is a portion which includes a diffusion layer formed by adding dopant to a semiconductor material at a higher concentration than the semiconductor substrate 31 and a rewiring layer including a conductive portion such as a wiring or land electrically coupled to the diffusion layer, an insulating film that insulates the conductive portions, and the like. These diffusion layer and rewiring layer form circuit elements such as a transistor, a diode, a resistor, and a capacitor. Then, a predetermined circuit is formed by combining the circuit elements. Therefore, the circuit 32 is, for example, an integrated circuit (IC), and is electrically coupled to the vibrator element 2 described later.

The circuit 32 according to the present embodiment is provided at the second surface 312 of the semiconductor substrate 31 as shown in FIG. 3. Accordingly, the circuit 32 is positioned so as to be attached to the semiconductor substrate 31 which is a part of a package forming the cavity 45, and is positioned outside the cavity 45. Therefore, for example, when an external terminal for electrically coupling the circuit 32 to the outside is provided, the external terminal can be formed in the manufacturing process of the IC substrate 3, so that there is no need to provide a wiring or the like penetrating the semiconductor substrate 31, formation of the external terminal is facilitated, and the miniaturization and thinning of the vibrator device 1 can be achieved.

The IC substrate 3 according to the present embodiment includes such a circuit 32 and constitutes a part of a package in which the cavity 45 is formed. Therefore, the circuit 32 is built in a part of the package, so that the miniaturization and thinning of the vibrator device 1 can be achieved.

A passivation film 33 is provided over the lower surface of the circuit 32 in FIG. 3. Accordingly, the circuit 32 can be protected. For example, silicon nitride (SiN) formed of plasma CVD can be used as the passivation film 33.

On the other hand, on the first surface 311 of the semiconductor substrate 31, as shown in FIG. 2 or 3, two mount electrodes 34 and 34, one capacitor electrode 35, and an insulating film 51 positioned between these electrodes 34 and 35 and the semiconductor substrate 31 are provided.

Two mount electrodes 34 and 34 are electrically and mechanically coupled to the vibrator element 2 through conductive bumps 6, 6, respectively. Accordingly, the vibrator element 2 is supported in a cantilevered form by the bumps 6, 6.

The capacitor electrode 35 is provided at the opposite side of the insulating film 51 from the semiconductor substrate 31. Therefore, the capacitor electrode 35 and the semiconductor substrate 31 are opposite electrodes opposite to each other through the insulating film 51. Accordingly, a capacitor C1 is configured of the insulating film 51, the capacitor electrode 35, and the semiconductor substrate 31.

The area of the capacitor electrode 35 may be equal to or less than the area of the mount electrode 34, but is preferably set to be larger. Accordingly, the capacitance of the capacitor C1 can be sufficiently increased, and the capacitor C1 can be used for various purposes. The area of the mount electrode 34 and the capacitor electrode 35 is obtained from the interface area between these electrodes 34 and 35 and the insulating film 51.

The area of the capacitor electrode 35 is appropriately set according to the required capacitance of the capacitor C1. As an example, the area of the capacitor electrode 35 is preferably 1.1 or more times the total area of the mount electrode 34, and more preferably 2.0 or more times the total area of the mount electrode 34. Accordingly, sufficient capacitance can be secured.

As described above, the IC substrate 3 includes the mount electrodes 34 and 34 electrically coupled to the vibrator element 2, the insulating film 51 provided over a surface of the semiconductor substrate 31, and the capacitor electrode 35 provided at the opposite side of the insulating film 51 from the semiconductor substrate 31 and having an area larger than the area of the mount electrode 34.

According to such a vibrator device 1, it is possible to easily increase or decrease the capacitance of the capacitor C1 constructed by the insulating film 51, the capacitor electrode 35, and the semiconductor substrate 31, and the capacitor C1 can be used for various purposes. Since the wiring length between the capacitor C1 and the circuit 32 can be made sufficiently short, inductance becomes very small, and for example, as described later, the capacitor C1 can function as a high performance decoupling capacitor. As a result, since there is no need to separately couple the decoupling capacitor to the outside of the vibrator device 1, the mounting cost when mounting the vibrator device 1 can be reduced and space can be saved.

External electrodes 361, 362, 363, and 364 are provided over the lower surface of the circuit 32 in FIG. 1.

Among these, the external electrode 361 is electrically coupled to the capacitor electrode 35 through a through wiring 371 which penetrates the semiconductor substrate 31 and the circuit 32 in the thickness direction. Accordingly, the external electrode 361 serves as a terminal which electrically couples the capacitor electrode 35 provided in the cavity 45 to the outside. In the present embodiment, as described above, a power supply potential Vdd is coupled to the external electrode 361.

The through wiring 371 is inserted into a through-hole 301 penetrating the semiconductor substrate 31 and the circuit 32 in the thickness direction. When the semiconductor substrate 31 is a silicon substrate, the through wiring 371 is formed, for example, using a through silicon via (TSV) technique. The insulating film 51 extends along an inner wall of the through-hole 301. Accordingly, the inner wall of the through-hole 301 and the through wiring 371 are insulated.

On the other hand, the external electrodes 362, 363, and 364 are electrically coupled to the circuit 32, respectively. Accordingly, a random signal can be input to the circuit 32 or a random signal generated from the circuit 32 can be output through the external electrodes 362, 363, and 364. In the present embodiment, a ground potential GND is coupled to any one of the external electrodes 362, 363, and 364. A control signal CONT shown in FIG. 4 is input to one of the remaining two electrodes, and an output signal F out shown in FIG. 4 is output from the other electrode. This circuit configuration is an example, and the present disclosure is not limited to this.

A wiring 320 shown in FIG. 3 is a wiring included in the circuit 32. Such a wiring 320 is electrically coupled to the mount electrode 34 through a through wiring 372 penetrating the semiconductor substrate 31 and the circuit 32 in the thickness direction. Accordingly, a signal for driving the vibrator element 2 can be output from the circuit 32 toward the mount electrode 34 and vibrate the vibrator element 2. This circuit configuration is an example, and the present disclosure is not limited to this.

The through wiring 372 is inserted into a through-hole 302 penetrating the semiconductor substrate 31 and the circuit 32 in the thickness direction. The insulating film 51 extends along the inner wall of the through-hole 302. Accordingly, the inner wall of the through-hole 302 and the through wiring 372 are insulated.

In the present embodiment, the semiconductor substrate 31 is coupled to the ground potential GND through an external electrode (not shown).

The insulating film 51 is not particularly limited as long as it is a film that can electrically insulate the semiconductor substrate 31 and the capacitor electrode 35 or the through wiring 371.

Examples of the constituent material of the insulating film 51 include a silicon compound such as silicon oxide and silicon nitride, glass, and resin.

The capacitor electrode 35 is not particularly limited as long as it is a conductive film disposed so as to sandwich the insulating film 51 with the semiconductor substrate 31.

Examples of the constituent material of the capacitor electrode 35 include a single element or an alloy containing gold, silver, copper, aluminum, nickel, tungsten, molybdenum, and the like. These materials are also used in electrodes other than the capacitor electrode 35 and in the wiring.

The shape and size of the lid 4 are set so as to substantially overlap the IC substrate 3 when viewed in the thickness direction of the semiconductor substrate 31. The lid 4 is directly bonded to the semiconductor substrate 31. Therefore, the airtightness of the bonding interface can be particularly improved. As a result, the vibrator element 2 placed in the cavity 45 can be protected from the external environment, and the reliability of the vibrator device 1 can be improved.

At the surface of the lid 4 facing the semiconductor substrate 31 side, a recessed portion 41 opened to the surface is formed. The cavity 45 for housing the vibrator element 2 is formed by the recessed portion 41. Then, as a result of the recessed portion 41 being formed, a wall portion 42 standing upright toward the semiconductor substrate 31 side is provided at the outer peripheral portion of the recessed portion 41. A lower surface 421 of the wall portion 42 in FIG. 3 is the bonding surface to be directly bonded to the outer peripheral portion of the first surface 311 of the semiconductor substrate 31.

The lid 4 is a P-type semiconductor as a conductivity type of a semiconductor having conductivity. The conductivity type of the semiconductor in the lid 4 is selected to be the same as the conductivity type of the semiconductor in the above-described semiconductor substrate 31. That is, in the present embodiment, since the semiconductor substrate 31 is a P-type semiconductor, the lid 4 is also a P-type semiconductor. Accordingly, the potential between the semiconductor substrate 31 and the lid 4 can be equal.

Examples of the main material of the lid 4 include various semiconductor materials such as silicon, germanium, silicon oxide, gallium nitride, indium gallium arsenide, and the like. Among these, the lid 4 is preferably made of silicon. Silicon is easy to obtain and process as a semiconductor material and is inexpensive.

The lid 4 is preferably a crystal substrate, and more preferably a single crystal substrate. Accordingly, in the direct bonding between the lid 4 and the semiconductor substrate 31, more airtight bonding can be performed at a lower temperature.

The direct bonding between the semiconductor substrate 31 and the lid 4 may be any type of bonding as long as it does not require an inclusion. Specifically, examples thereof include activated bonding such as activated bonding at a normal temperature and plasma activated bonding, diffusion bonding, and the like. Among these, activated bonding is preferably used. In the activated bonding, after the surface of an adherend is activated by an activation method such as ion beam, plasma, or mechanical polishing, the treated surfaces are bonded to each other. Accordingly, the semiconductor substrate 31 and the lid 4 are firmly bonded.

In the present embodiment, both the semiconductor substrate 31 and the lid 4 can be maintained at the ground potential GND. Therefore, the package formed of the semiconductor substrate 31 and the lid 4 can function as an electromagnetic shield. As a result, it is possible to suppress the electromagnetic noise from the outside which is superimposed on the electrode, wiring, and the like provided in the electromagnetic shield, and it is possible to suppress the occurrence of a defect such as abnormal oscillation. Moreover, in the circuit 32 adjacent to the electromagnetic shield, the influence of the electromagnetic noise from the outside can be minimized. Accordingly, it is possible to suppress the occurrence of defects such as an increase in jitter in the output signal and an increase in phase noise included in the output signal.

On the contrary, it is possible to suppress the emission of electromagnetic noise from the wiring or the circuit 32 toward the outside. Therefore, the occurrence of electromagnetic interference in other circuits provided around the vibrator device 1 can be suppressed.

The bonding surface of the direct bonding has good airtightness. Therefore, it is easy to make the cavity 45 an airtight space. When the direct bonding process is performed under reduced pressure or under a predetermined gas, the inside of the cavity 45 can be maintained under reduced pressure or can be filled with a predetermined gas. Accordingly, the reliability of the vibrator device 1 can be improved.

The inside of the cavity 45 is preferably maintained under reduced pressure. Accordingly, it is possible to suppress temporal degeneration of the vibrator element 2, the electrodes, and the like, and to improve the aging characteristics of the vibrator device 1.

As described above, the vibrator device 1 includes the vibrator element 2, the IC substrate 3 including the semiconductor substrate 31 and the circuit 32 electrically coupled to the vibrator element 2, and the lid 4 directly bonded to the semiconductor substrate 31, and the semiconductor substrate 31 and the lid 4 are each a P-type semiconductor.

According to such a vibrator device 1, the formation of PN junction between the semiconductor substrate 31 and the lid 4 is prevented, and the potential between the semiconductor substrate 31 and the lid 4 can be equal to each other. Therefore, the influence of the electromagnetic noise from the outside can be minimized in the vibrator device 1. Moreover, the leakage of electromagnetic noise from the vibrator device 1 to the outside can be minimized.

Further, in the direct bonding, since the bonding strength and the airtightness of the bonding surface can be particularly improved, a highly reliable vibrator device 1 can be realized.

Here, FIG. 4 is an example of a circuit configuration in the circuit 32. The circuit 32 shown in FIG. 4 includes a control circuit 321, an oscillator circuit 322, and an output circuit 323. The power supply potential Vdd and the ground potential GND are coupled to the control circuit 321, the oscillator circuit 322, and the output circuit 323, respectively.

The control signal CONT can be input to the control circuit 321 from the outside. The control circuit 321 is configured to output a control signal CNT1 toward the oscillator circuit 322, and the control circuit 321 is configured to output a control signal CNT2 toward the output circuit 323.

The output signal output from the oscillator circuit 322 can be output the outside through the output circuit 323.

FIG. 5 is a circuit diagram showing an example of a circuit configuration of the oscillator circuit 322 shown in FIG. 4.

The oscillator circuit 322 shown in FIG. 5 is a region surrounded by a broken line. The vibrator element 2 can be oscillated by the oscillator circuit 322.

The oscillator circuit 322 shown in FIG. 5 includes an inverter INV and a feedback resistor Rf coupled to the vibrator element 2 in parallel. Furthermore, an amplitude limiting resistor Rd is coupled between the feedback resistor Rf and the vibrator element 2 in a line between the output side of the inverter INV and the ground potential GND.

A frequency adjusting capacitor Cg is coupled between the input side of the inverter INV and the ground potential GND. Moreover, a frequency adjusting capacitor Cd is coupled between the amplitude limiting resistor Rd and the ground potential GND.

As described above, the circuit 32 includes the oscillator circuit 322 which drives the vibrator element 2. Accordingly, the vibrator element 2 can be resonantly driven, and a clock signal can be output toward the output circuit 323.

The above-described capacitor C1 is provided between the line of the power supply potential Vdd and the line of the ground potential GND shown in FIG. 4 to be close to such a circuit 32. This capacitor C1 functions as a decoupling capacitor. Therefore, for example, the electromagnetic noise generated in the circuit 32 can be removed or attenuated by the decoupling capacitor. Accordingly, it is possible to obtain the decoupling effect of suppressing the electromagnetic interference due to electromagnetic noise being superimposed on the line of the power supply potential Vdd, for example, the occurrence of malfunction in other circuits coupled to this line or suppressing the malfunction of the circuit 32 and the vibrator element 2 caused by the electromagnetic noise from the outside being superimposed on the circuit 32 and the wiring around it. Particularly, in the circuit 32, electromagnetic noise is apt to occur at the time of the oscillation operation of the oscillator circuit 322 and the clock output operation of the output circuit 323. Therefore, by providing the decoupling capacitor, it is possible to suppress such electromagnetic noise from being transmitted to another circuit causing malfunction of the other circuit.

As described above, the above-described capacitor C1 is constructed using the semiconductor substrate 31 and the insulating film 51 formed on the first surface 311 and the capacitor electrode 35. Therefore, the decoupling capacitor is disposed at a position very close to the circuit 32 and the vibrator element 2, and the wiring length from the circuit 32 and the vibrator element 2 can be substantially shortened. Accordingly, it is possible to suppress the decoupling effect reduced due to the influence of the inductance caused by the increase in the wiring length, and to improve the decoupling effect by the capacitance of the capacitor C1.

The insulating film 51 included in the capacitor C1 is provided over the first surface 311 side of the surface of the semiconductor substrate 31, the first surface, facing the vibrator element 2. That is, the insulating film 51 is provided in the cavity 45 which accommodates the vibrator element 2 of the semiconductor substrate 31. Accordingly, the decoupling capacitor can be constructed while effectively using the space of the cavity 45. Therefore, a decoupling capacitor built-in vibrator device 1 can be realized while avoiding upsizing of the vibrator device 1. Another film other than the insulating film 51 may be provided between the semiconductor substrate 31 and the capacitor electrode 35.

As described above, the vibrator device 1 includes the capacitor C1 that can function as a decoupling capacitor provided between the power supply potential Vdd and the ground potential GND. However, this capacitor C1 is, as described above, configured of the insulating film 51, the capacitor electrode 35, and the semiconductor substrate 31. That is, by using the semiconductor substrate 31 having conductivity as an electrode of the capacitor C1, the decoupling capacitor can be disposed at a position very close to the vibrator element 2 and the circuit 32.

According to such a vibrator device 1, it is possible to more reliably suppress the malfunction of the circuit 32 due to the electromagnetic noise being superimposed on the line of the power supply potential Vdd.

The capacitance of the capacitor C1 is appropriately set in consideration of the impedance characteristics to the frequency of the electromagnetic noise to be removed. It is not particularly limited, but is preferably 10 pF or more, more preferably 50 pF or more, and still more preferably 100 pF or more. In addition to the impedance characteristics, in consideration of the plane size of the capacitor C1 necessary for the miniaturization of the vibrator device 1, the capacitance of the capacitor C1 is preferably from 10 pF to 1 μF, more preferably from 50 pF to 500 pF, and still more preferably from 100 pF to 500 pF. Accordingly, a sufficient decoupling effect can be obtained.

The thickness of the insulating film 51 is appropriately set according to the capacitance required for the capacitor C1, the relative dielectric constant of the insulating film 51, and the like, but is preferably from 0.01 μm to 10 m, and more preferably from 0.05 μm to 1 μm. Accordingly, the thickness of the insulating film 51 can be secured to improve the reliability, and the capacitance of the capacitor C1 can be secured to obtain a sufficient decoupling effect.

The area of the capacitor electrode 35 is also appropriately set according to the capacitance required for the capacitor C1 and the like, but is preferably from 0.1 $mm^2$ to 10 $mm^2$, and more preferably from 0.3 $mm^2$ to 5 $mm^2$. Accordingly, the capacitance of the capacitor C1 can be secured, and a sufficient decoupling effect can be obtained.

The thickness of the semiconductor substrate 31 is not particularly limited, but is preferably from 20 μm to 200 μm, and more preferably from 30 μm to 150 μm. Accordingly, the wiring length between the circuit 32 and the capacitor C1 can be made sufficiently short, and a sufficient decoupling effect can be obtained. Moreover, the vibrator device 1 with sufficient thickness reduction can be obtained.

As described above, the semiconductor substrate 31 and the lid 4 are each a P-type semiconductor, the semiconductor substrate 31 is coupled to the ground potential GND, and the capacitor electrode 35 is coupled to the power supply potential Vdd.

As described above, according to such a vibrator device 1, the capacitor C1 is coupled between the power supply potential Vdd and the ground potential GND. Accordingly, the decoupling capacitor built-in vibrator device 1 can be realized without providing a separate capacitor outside the vibrator device 1.

Second Embodiment

Next, a second embodiment of the vibrator device will be described.

Figure 6:
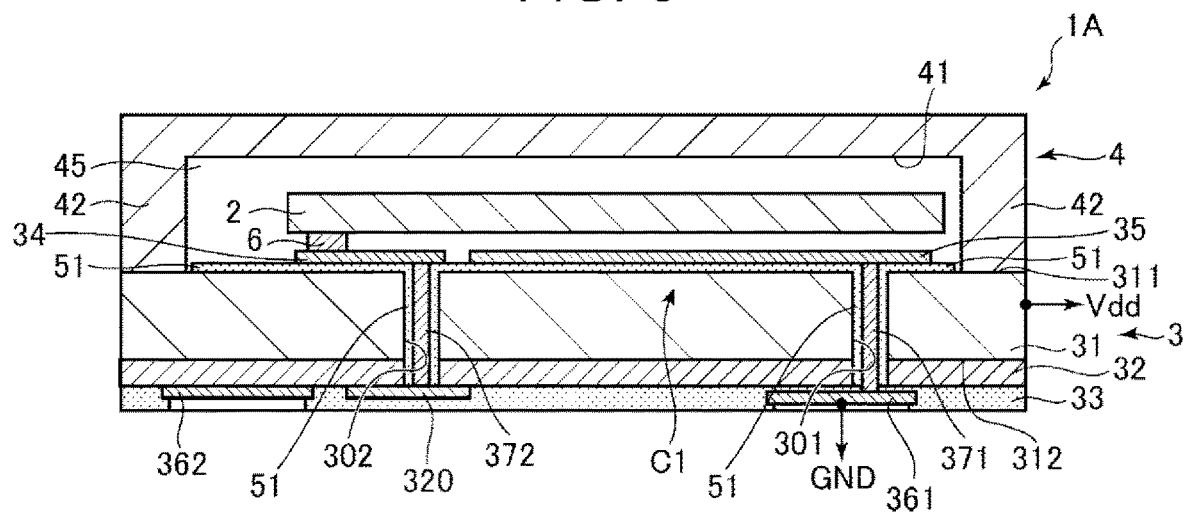
FIG. 6 is a sectional view showing a vibrator device according to a second embodiment.

FIG. 6 is a sectional view showing a second embodiment of the vibrator device.

Hereinafter, the second embodiment will be described. In the following description, differences from the first embodiment will be mainly described, and the description of the same matters will be omitted. In FIG. 6, the same components as those in the above-described embodiment are denoted by the same reference numerals.

In the first embodiment, while the semiconductor substrate 31 is a P-type semiconductor, in the present embodiment, the semiconductor substrate 31 is configured of an N-type semiconductor which is an N-type semiconductor of the conductivity type having similar conductivity.

Accordingly, the potentials coupled to the semiconductor substrate 31 and the capacitor electrode 35 are switched. In other respects, the present embodiment is the same as the first embodiment.

When the main material of the semiconductor substrate 31 is, for example, silicon, phosphorus ions, arsenic ions, and the like are added as a dopant on the semiconductor substrate 31 of the N-type semiconductor.

Furthermore, in the present embodiment, the lid 4 is also an N-type semiconductor and has conductivity.

As described above, in a vibrator device 1A according to the present embodiment, the semiconductor substrate 31 and the lid 4 are each an N-type semiconductor. The semiconductor substrate 31 is coupled to the power supply potential Vdd through an external electrode (not shown), and the capacitor electrode 35 is coupled to the ground potential GND through the external electrode 361. Accordingly, the potential between the semiconductor substrate 31 and the lid 4 can be equal. As a result, the influence of the electromagnetic noise from the outside can be minimized in the vibrator device 1A. Moreover, the leakage of electromagnetic noise from the vibrator device 1 to the outside can be minimized.

Also in the second embodiment as described above, the same effect as the first embodiment can be obtained.

Third Embodiment

Next, a third embodiment of the vibrator device will be described.

Figure 7:
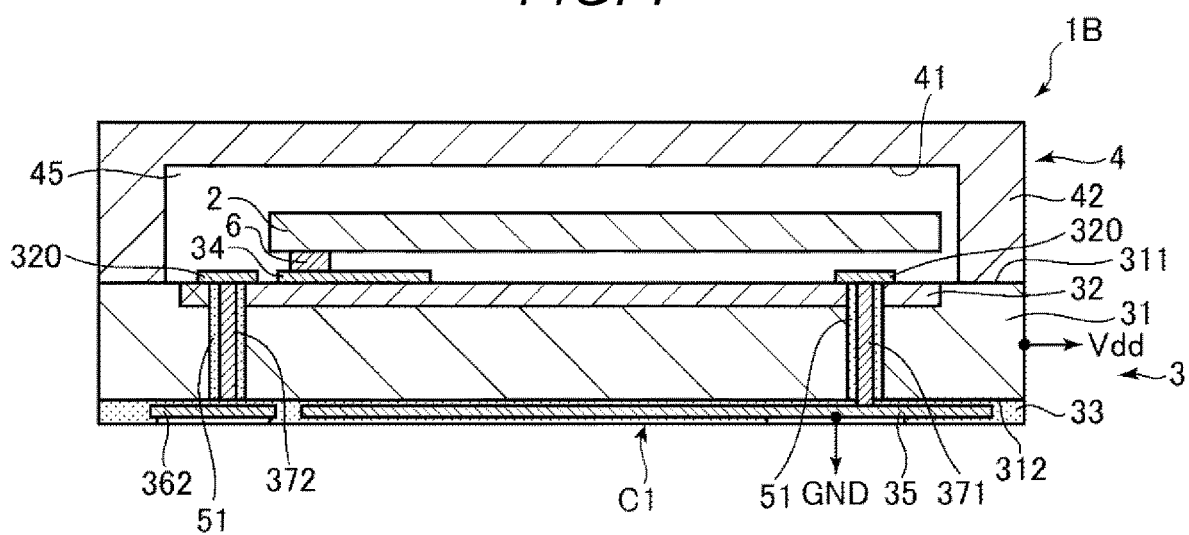
FIG. 7 is a sectional view showing a vibrator device according to a third embodiment.

FIG. 7 is a sectional view showing a third embodiment of the vibrator device.

Hereinafter, the third embodiment will be described. In the following description, differences from the second embodiment will be mainly described, and the description of the same matters will be omitted. In FIG. 7, the same components as those in the above-described embodiment are denoted by the same reference numerals.

In a vibrator device 1B according to the present embodiment, the semiconductor substrate 31 and the lid 4 are each an N-type semiconductor and are directly bonded to each other. The insulating film 51 and the capacitor electrode 35 according to the present embodiment are respectively provided at the second surface 312 of the surface of the semiconductor substrate 31, that is, the second surface 312 on the opposite side to the first surface 311, the second surface, facing the vibrator element 2. Accordingly, the circuit 32 and the wiring 320 included therein are provided in the cavity 45. Accordingly, since the capacitor C1 can be disposed outside the cavity 45, for example, it is easy to adjust the area of the capacitor electrode 35 outside the cavity 45 and adjust the capacitance of the capacitor C1.

As described above, since the capacitor electrode 35 has a sufficiently large area, it is disposed so as to overlap most of the circuit 32. Therefore, the capacitor electrode 35 itself can also function as the electromagnetic shield that covers the circuit 32, and the electromagnetic noise resistance of the vibrator device 1B shown in FIG. 7 can be further improved.

In the example of the present embodiment, a part of the wiring 320 is electrically coupled to the external electrode 362 through the through wiring 372, and another part is electrically coupled to the capacitor electrode 35 through the through wiring 371. This circuit configuration is an example, and the present disclosure is not limited to this.

Also in the third embodiment as described above, the same effect as the first and second embodiments can be obtained.

In FIG. 7, the semiconductor substrate 31 is coupled to the power supply potential Vdd, and the capacitor electrode 35 is coupled to the ground potential GND. However, contrary to FIG. 7, the semiconductor substrate 31 may be coupled to the ground potential GND, and the capacitor electrode 35 may be coupled to the power supply potential Vdd.

Fourth Embodiment

Next, a fourth embodiment of the vibrator device will be described.

Figure 8:
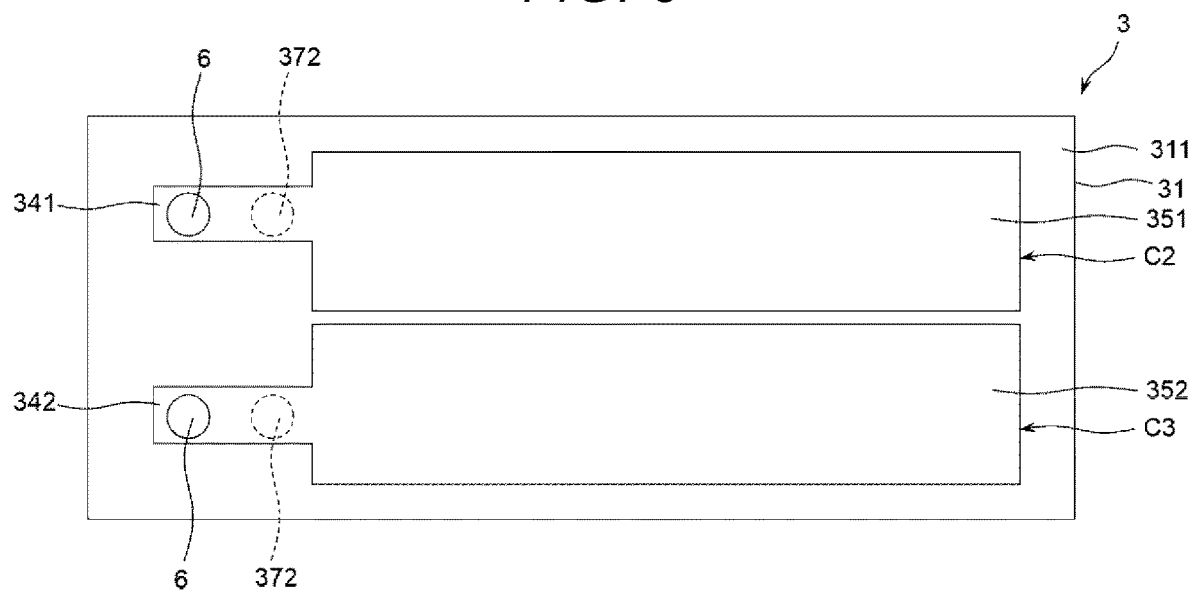
FIG. 8 is a plan view showing an IC substrate provided in a vibrator device according to a fourth embodiment.
Figure 9:
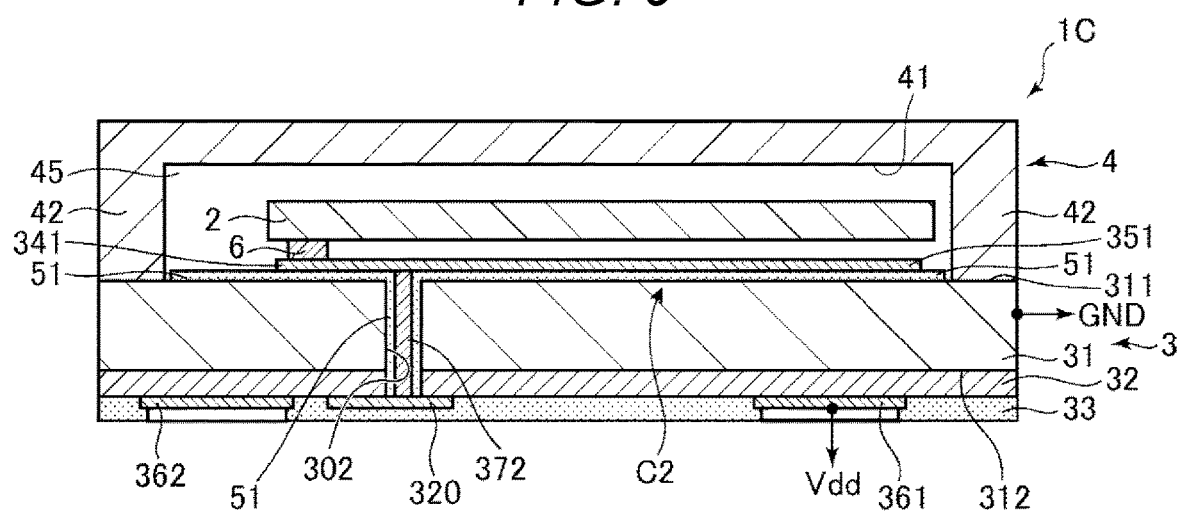
FIG. 9 is a sectional view of the vibrator device provided with the IC substrate shown in FIG. 8.
Figure 10:
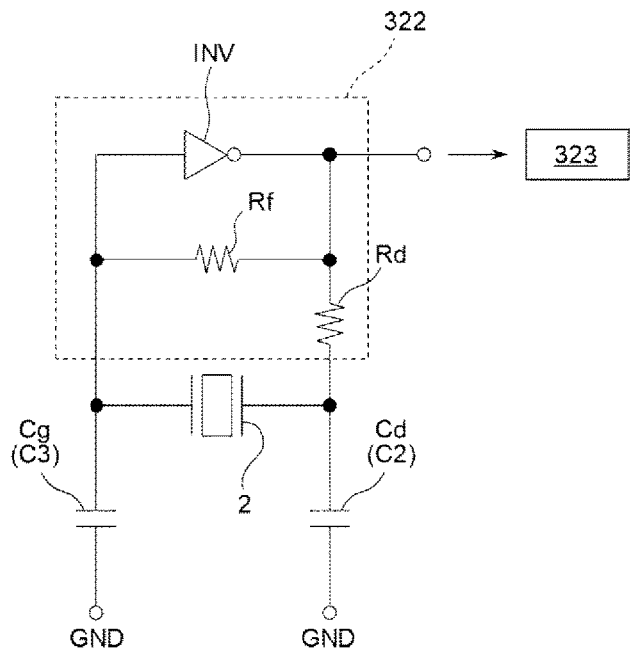
FIG. 10 is a circuit diagram showing a part of a circuit formed at the IC substrate shown in FIG. 8.

FIG. 8 is a plan view showing an IC substrate provided in a fourth embodiment of the vibrator device. FIG. 9 is a sectional view of the vibrator device provided with the IC substrate shown in FIG. 8. FIG. 10 is a circuit diagram showing a part of a circuit formed at the IC substrate in FIG. 8.

Hereinafter, the fourth embodiment will be described. In the following description, differences from the first embodiment will be mainly described, and the description of the same matters will be omitted. In FIG. 8, the same components as those in the above-described embodiment are denoted by the same reference numerals.

In the vibrator device according to the above-described first to third embodiments, the capacitor C1 functions as a decoupling capacitor, but a vibrator device 1C according to the present embodiment is different in that capacitors C2 and C3 shown in FIG. 8 function as frequency adjusting capacitors.

That is, in the vibrator device 1C shown in FIG. 8, the semiconductor substrate 31 and the lid 4 are each a P-type semiconductor and are directly bonded to each other. The vibrator device 1C includes two mount electrodes 341 and 342 and two capacitor electrodes 351 and 352 provided at the first surface 311 of the semiconductor substrate 31. These electrodes and the semiconductor substrate 31 are insulated through the insulating film 51. Therefore, the capacitor C2 is constituted of the insulating film 51, the capacitor electrode 351, and the semiconductor substrate 31. Moreover, the capacitor C3 is constituted of the insulating film 51, the capacitor electrode 352, and the semiconductor substrate 31.

The mount electrode 341 and the capacitor electrode 351 are electrically coupled to each other. The mount electrode 342 and the capacitor electrode 352 are electrically coupled to each other.

Furthermore, the through wiring 372 penetrates the semiconductor substrate 31 and the circuit 32 in the thickness direction as shown in FIG. 9. As in the first embodiment, the mount electrodes 341 and 342 and the wiring 320 are electrically coupled through the through wiring 372.

On the other hand, the external electrodes 361 and 362 according to the present embodiment are electrically coupled to the circuit 32, respectively. In the present embodiment, the external electrode 361 is coupled to the power supply potential Vdd as an example.

The semiconductor substrate 31 according to the present embodiment is coupled to the ground potential GND through an external electrode (not shown).

Here, such capacitors C2 and C3 function as the frequency adjusting capacitors Cd and Cg shown in FIG. 10. That is, in the present embodiment, the frequency adjusting capacitors Cd and Cg are not included in the oscillator circuit 322 as shown in FIG. 10. Instead, the capacitors C2 and C3 provided outside the circuit 32 serve as the frequency adjusting capacitors Cd and Cg.

That is, the vibrator device 1C according to the present embodiment has the capacitor C2 provided between the mount electrode 341 and the ground potential GND as the frequency adjusting capacitor Cd. As described above, the capacitor C2 is configured of the insulating film 51, the capacitor electrode 351, and the semiconductor substrate 31.

The vibrator device 1C according to the present embodiment has the capacitor C3 provided between the mount electrode 342 and the ground potential GND as the frequency adjusting capacitor Cg. As described above, the capacitor C3 is configured of the insulating film 51, the capacitor electrode 352, and the semiconductor substrate 31.

According to such a vibrator device 1C, the oscillation frequency of the vibrator device 1C can be adjusted without separately providing a frequency adjusting capacitor outside the vibrator device 1C. Therefore, the mounting cost of the vibrator device 1C can be reduced and space can be saved.

The oscillation frequency can be adjusted by appropriately changing the capacitance of the frequency adjusting capacitor Cd and the capacitance of the frequency adjusting capacitor Cg by a known method. Therefore, the oscillation frequency can be adjusted by appropriately changing the thickness of the insulating film 51 and the areas of the capacitor electrodes 351 and 352 in the capacitors C2 and C3.

Also in the fourth embodiment as described above, the same effect as the first to third embodiments can be obtained.

Method of Manufacturing Vibrator Device

Next, an embodiment of a method of manufacturing the vibrator device will be described.

Figure 11:
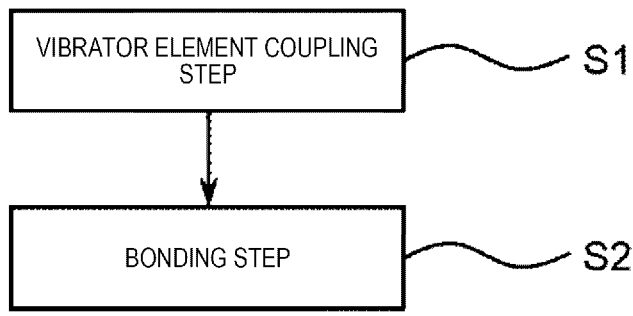
FIG. 11 is a flowchart for explaining an embodiment of a method of manufacturing a vibrator device.

FIG. 11 is a flowchart for explaining an embodiment of a method of manufacturing a vibrator device. FIGS. 12 to 17 are diagrams for explaining the manufacturing method shown in FIG. 11. In the description below, a method of manufacturing the vibrator device 1 shown in FIG. 3 will be described. In the description below, a case where the semiconductor substrate 31 and the lid 4 each contain silicon as a main material will be described.

As shown in FIG. 11, the method of manufacturing the vibrator device 1 includes a vibrator element coupling step S1 and a bonding step S2. The respective steps will be sequentially described below.

1 Vibrator Element Coupling Step S1

1-1 Manufacture of IC Substrate 3

Figure 12:
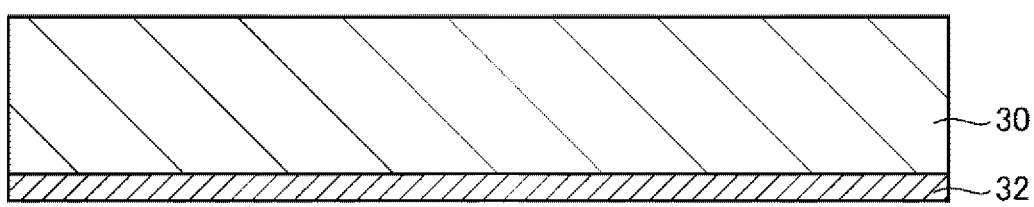
FIG. 12 is a diagram for explaining the manufacturing method shown in FIG. 11.

First, a silicon substrate 30 for forming the IC substrate 3 is prepared as shown in FIG. 12. The silicon substrate 30 according to the present embodiment is a P-type semiconductor. The silicon substrate 30 may be an N-type semiconductor. In addition, the circuit 32 is formed at the silicon substrate 30 in advance.

Next, polishing treatment is performed as needed. Accordingly, the silicon substrate 30 is thinned.

Figure 13:
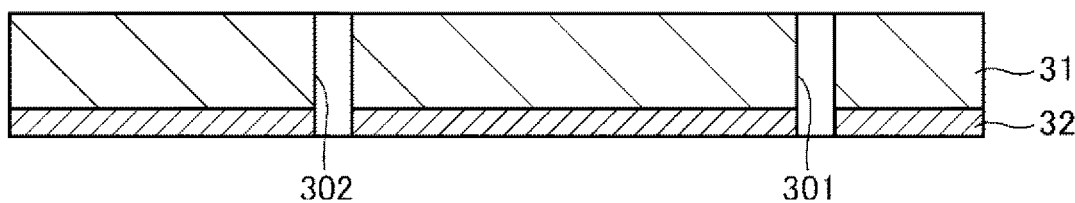
FIG. 13 is a diagram for explaining the manufacturing method shown in FIG. 11.

Next, as shown in FIG. 13, the through-holes 301 and 302 are formed in the silicon substrate 30 and the circuit 32. The through-holes 301 and 302 can be formed, for example, by a dry etching method using inductively coupled plasma (ICP). Accordingly, the semiconductor substrate 31 is obtained from the silicon substrate 30.

Figure 14:
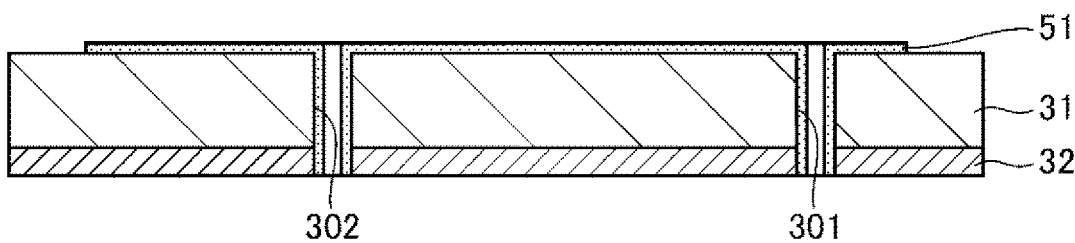
FIG. 14 is a diagram for explaining the manufacturing method shown in FIG. 11.
Figure 15:
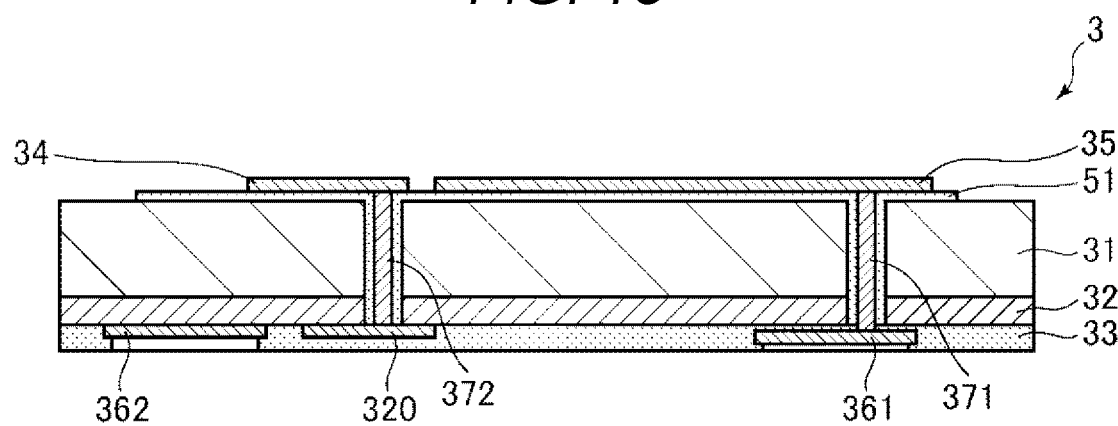
FIG. 15 is a diagram for explaining the manufacturing method shown in FIG. 11.

Next, as shown in FIG. 14, the insulating film 51 is formed on the semiconductor substrate 31 by various vapor deposition methods. The method of forming the insulating film 51 is not limited to this. For example, the surface of the silicon substrate 30 or the inner wall surfaces of the through-holes 301 and 302 may be oxidized.

Next, a conductive material such as a copper (Cu) is deposited on the surface of the semiconductor substrate 31 or the inner wall surfaces of the through-holes 301 and 302. Materials such as gold (Au), palladium (Pd), and nickel (Ni) may be stacked and formed as needed. For example, an electrolytic plating method, a vapor phase film forming method, or the like is used for forming these films.

After the conductive material is formed into a film as described above, it is patterned into a desired shape by various patterning methods. Accordingly, the mount electrode 34, the capacitor electrode 351, the external electrodes 361 and 362, the through wirings 371 and 372, and the like can be formed.

Thereafter, the passivation film 33 is formed, and the passivation film 33 is patterned so that the external electrodes 361 and 362 are exposed.

As described above, the IC substrate 3 shown in FIG. 15 can be obtained.

1-2 Coupling of Vibrator Element 2

Figure 16:
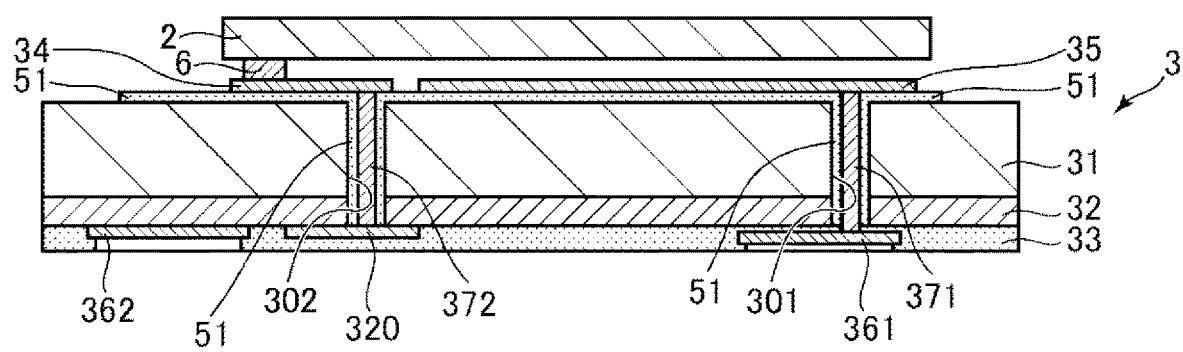
FIG. 16 is a diagram for explaining the manufacturing method shown in FIG. 11.

Next, the vibrator element 2 is prepared and placed on the IC substrate 3. As shown in FIG. 16, the vibrator element 2 and the IC substrate 3 are coupled through the bump 6.

Specifically, first, the bump 6 is formed at the IC substrate 3 side. Next, the vibrator element 2 and the bump 6 are connected by a method such as thermocompression bonding. Accordingly, the vibrator element 2 can be supported by the bump 6.

For the bump 6, for example, various metal materials are used. Instead of the bump 6, a conductive adhesive may be used.

2 Bonding Step S2

2-1 Manufacture of Lid 4

Next, a silicon substrate (not shown) for forming the lid 4 is prepared. The lid 4 according to the present embodiment is a P-type semiconductor. When the above-described semiconductor substrate 31 is an N-type semiconductor, the lid 4 is an N-type semiconductor. That is, the conductivity type of the semiconductor of the lid 4 is set to be the same as the conductivity type of the silicon substrate 30.

Next, the recessed portion 41 as shown in FIG. 3 is formed in the prepared silicon substrate. The recessed portion 41 can be formed, for example, by a dry etching method using inductively coupled plasma (ICP).

The lid 4 is obtained as described above.

2-2 Stacking of Semiconductor Substrate and Lid

Figure 17:
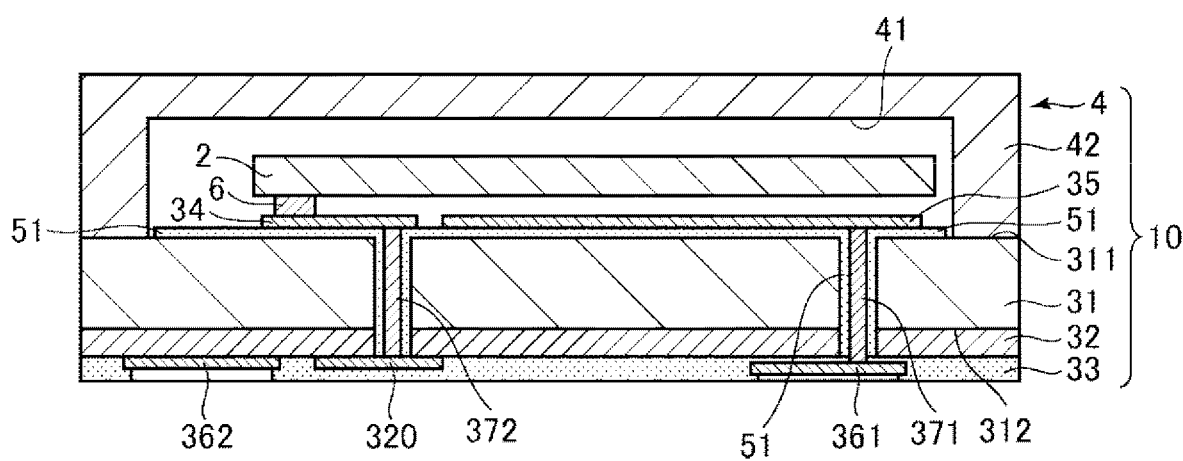
FIG. 17 is a diagram for explaining the manufacturing method shown in FIG. 11.

Next, as shown in FIG. 17, the semiconductor substrate 31 and the lid 4 are stacked to obtain a laminate 10 so that the vibrator element 2 is accommodated in the recessed portion 41 of the lid 4.

Next, the obtained laminate 10 is placed in a chamber of a bonding apparatus. By reducing the pressure in the chamber, the semiconductor substrate 31 and the lid 4 are in close contact with each other, and both are directly bonded by maintaining a predetermined time. Here, the inside of the cavity 45 formed between the semiconductor substrate 31 and the lid 4 is maintained under reduced pressure. The vibrator device 1 shown in FIG. 3 is obtained in this way.

The above-described method of manufacturing such a vibrator device 1 according to the present embodiment includes the vibrator element coupling step S1 of placing the vibrator element 2 on the IC substrate 3 including the semiconductor substrate 31 configured of a first conductive type semiconductor and the circuit 32 and electrically coupling the circuit 32 and the vibrator element 2, the conductive type of the semiconductor being any one of an N-type and a P-type, and a bonding step S2 of overlaying the lid 4 configured of the first conductive type semiconductor with the IC substrate 3 to cover the vibrator element 2 and directly bonding the semiconductor substrate 31 and the lid 4.

According to such a manufacturing method, the formation of PN junction between the semiconductor substrate 31 and the lid 4 is prevented, and the potential between the semiconductor substrate 31 and the lid 4 can be equal to each other. Therefore, the influence of the electromagnetic noise from the outside can be minimized in the vibrator device 1. Moreover, the leakage of electromagnetic noise from the vibrator device 1 to the outside can be minimized.

Electronic Apparatus

Figure 18:
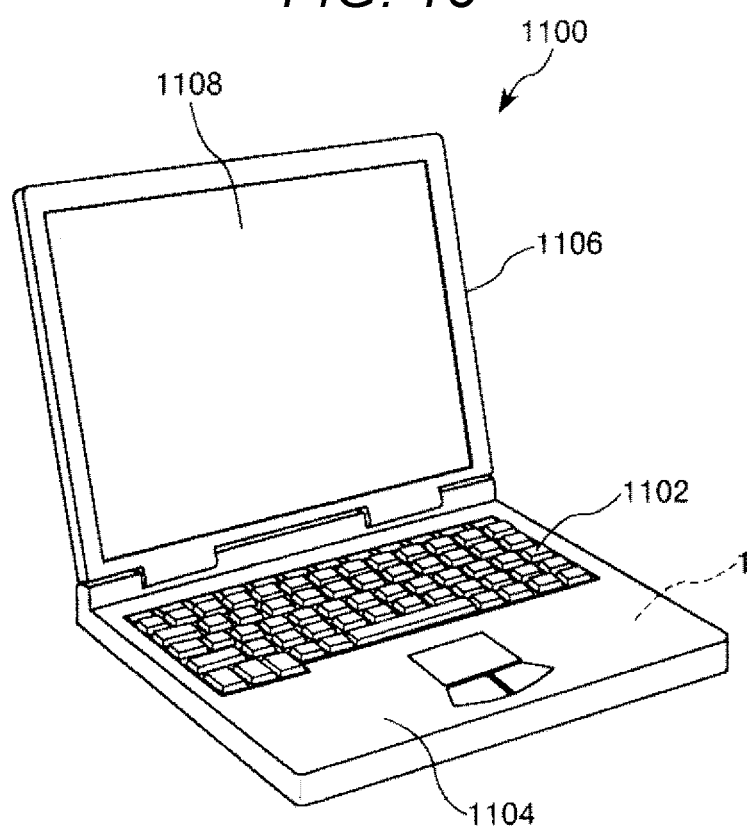
FIG. 18 is a perspective view showing a mobile personal computer which is an example of an embodiment of an electronic apparatus.

FIG. 18 is a perspective view showing a mobile personal computer which is an example of an embodiment of an electronic apparatus.

In FIG. 18, a personal computer 1100 is configured of a main unit 1104 including a keyboard 1102 and a display unit 1106 including a display portion 1108, and the display unit 1106 is rotatably supported by the main unit 1104 through a hinge structure. Such a personal computer 1100 has the vibrator device 1 that functions as a filter, a resonator, a reference clock source, and the like built therein. When the vibrator device 1 is made to function as a reference clock source, the vibrator device 1 outputs a reference clock signal, and the main unit 1104 can include an arithmetic processing unit that operates based on the reference clock signal.

Figure 19:
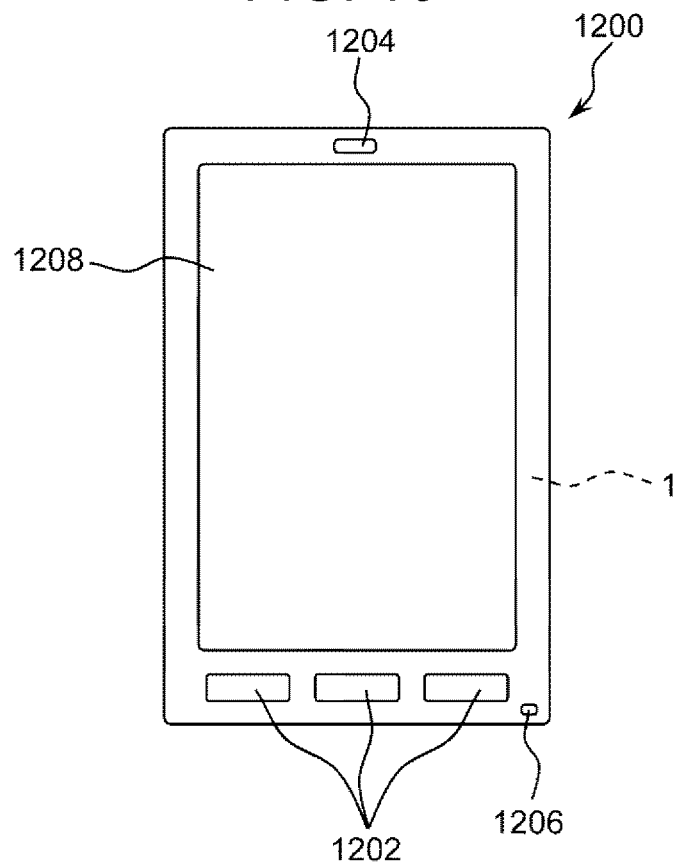
FIG. 19 is a plan view showing a mobile phone which is an example of the embodiment of the electronic apparatus.

FIG. 19 is a plan view showing a mobile phone which is an example of the embodiment of the electronic apparatus.

In FIG. 19, a mobile phone 1200 includes an antenna (not shown), a plurality of operation buttons 1202, an ear piece 1204, and a mouth piece 1206, and a display portion 1208 is disposed between the operation buttons 1202 and the ear piece 1204. Such a mobile phone 1200 has the vibrator device 1 that functions as a filter, a resonator, a reference clock source, and the like built therein. When the vibrator device 1 is made to function as a reference clock source, the vibrator device 1 outputs a reference clock signal, and the mobile phone 1200 can include an arithmetic processing unit that operates based on the reference clock signal.

Figure 20:
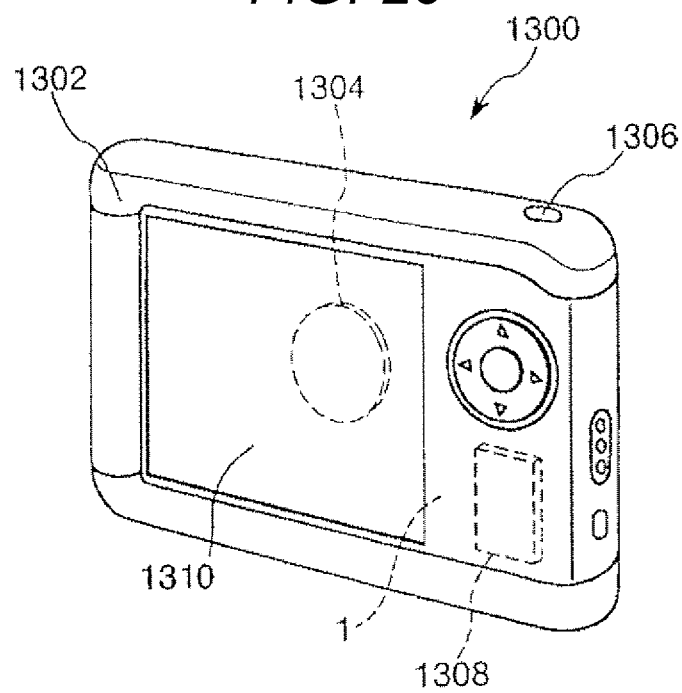
FIG. 20 is a perspective view showing a digital still camera which is an example of the embodiment of the electronic apparatus.

FIG. 20 is a perspective view showing a digital still camera which is an example of the embodiment of the electronic apparatus.

In FIG. 20, a display portion 1310 is provided at a rear surface of a case 1302 in a digital still camera 1300 to perform display based on an imaging signal by a CCD, and the display portion 1310 functions as a finder that displays an object as an electric image. A light receiving unit 1304 including an imaging optical system such as an optical lens, a CCD, and the like is provided over the front side of the case 1302, that is, the back side in FIG. 20. When a photographer checks the object image displayed on the display portion 1310 and presses a shutter button 1306, the imaging signal of the CCD at that time is transferred and stored in a memory 1308. Such a digital still camera 1300 has the vibrator device 1 that functions as a filter, a resonator, a reference clock source, and the like built therein. When the vibrator device 1 is made to function as a reference clock source, the vibrator device 1 outputs a reference clock signal, and the digital still camera 1300 can include an arithmetic processing unit that operates based on the reference clock signal.

The above-described electronic apparatus includes the vibrator device 1. According to such an electronic apparatus, the excellent electromagnetic noise resistance of the vibrator device 1 can be used to improve the characteristics of the electronic apparatus such as the reliability.

In addition to a personal computer in FIG. 18, a mobile phone in FIG. 19, and a digital still camera in FIG. 20, the electronic apparatus of the present disclosure can be applied to, for example, a smart phone, a tablet terminal, a watch including a smart watch, an ink jet discharging device such as an ink jet printer, a wearable terminal such as a head mount display (HMD), a laptop personal computer, a television, a video camera, a video tape recorder, a car navigation system, a pager, an electronic organizer including communication function, an electronic dictionary, a calculator, electronic games, a word processor, a work station, a videophone, TV monitor for crime prevention, electronic binoculars, a POS terminal, medical devices such as an electronic thermometer, a sphygmomanometer, a blood glucose meter, an electrocardiogram measuring device, an ultrasound diagnostic device, and an electronic endoscope, a fish finder, various measuring devices, various types of gauges such as gauges for a vehicle, an aircraft, or a ship, a base station for mobile terminal, a flight simulator, and the like.

Vehicle

Figure 21:
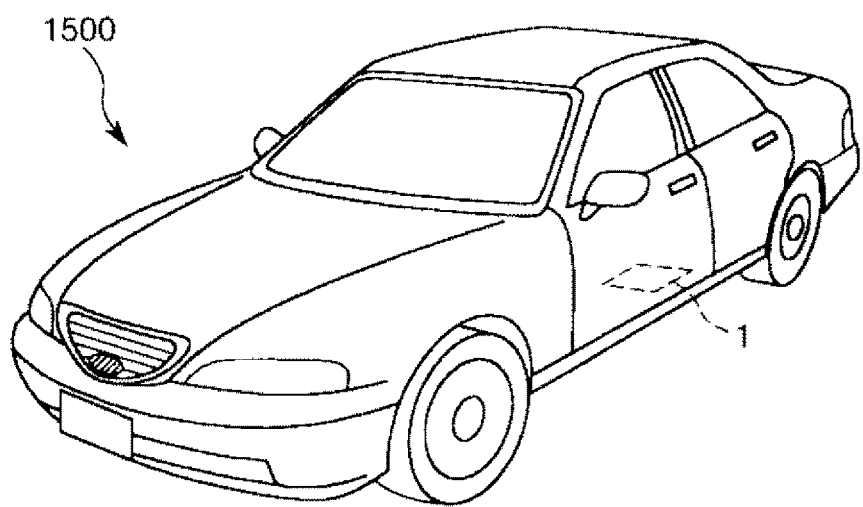
FIG. 21 is a perspective view showing an automobile which is an example of an embodiment of a vehicle.

FIG. 21 is a perspective view showing an automobile which is an example of an embodiment of a vehicle.

In an automobile 1500 shown in FIG. 21, the above-described vibrator device 1 is built therein. The vibrator device 1 can be widely applied to an electronic control unit (ECU) such as a keyless entry system, an immobilizer, a car navigation system, a car air-conditioner, an antilock brake system (ABS), an air-bag system, a tire pressure monitoring system (TPMS), an engine controller, a braking system, a battery monitoring system for a hybrid car or an electric car, or a vehicle posture control system. When the vibrator device 1 is made to function as a reference clock source, the vibrator device 1 outputs a reference clock signal, and the automobile 1500 can include an arithmetic processing unit that operates based on the reference clock signal.

Such an automobile 1500 includes the vibrator device 1. According to such an automobile 1500, the excellent electromagnetic noise resistance of the vibrator device 1 can be used to improve the reliability of the electronic apparatus.

The vehicle of the present disclosure can also be applied to a robot, drone, two-wheeled vehicles, an aircraft, a ship, a train, a rocket, a space ship, and the like in addition to the automobile shown in FIG. 21.

As described above, the vibrator device, the method of manufacturing the vibrator device, the electronic apparatus, and the vehicle according to the present disclosure have been described based on the illustrated embodiments, but the present disclosure is not limited to this. It can be replaced with any configuration having a similar function. Any other component may be added to the present disclosure.

Moreover, as a constituent material of the above-described vibrator element, materials other than the above-described quartz, for example, piezoelectric single crystal such as a lithium tantalate and lithium niobate, and piezoelectric ceramics may be used.

What is claimed is:

1. A vibrator device comprising:
a vibrator element;
an IC substrate including a semiconductor substrate configured of a semiconductor having a first conductive type and a circuit electrically coupled to the vibrator element, the first conductive type being any one of an N-type and a P-type; and
a lid directly bonded to the semiconductor substrate and configured of a semiconductor having the first conductive type semiconductor, wherein
the IC substrate includes
a mount electrode electrically coupled to the vibrator element,
an insulating film provided over a surface of the semiconductor substrate, and
a capacitor electrode provided at an opposite side of the insulating film from the semiconductor substrate and having an area larger than the area of the mount electrode.

2. The vibrator device according to claim 1, wherein both the semiconductor substrate and the lid are made of silicon.

3. The vibrator device according to claim 1, wherein the first conductive type is N-type, and
the semiconductor substrate is coupled to power supply potential, and the capacitor electrode is coupled to a ground potential.

4. The vibrator device according to claim 1, wherein the first conductive type is P-type, and
the semiconductor substrate is coupled to a ground potential, and the capacitor electrode is coupled to a power supply potential.

5. The vibrator device according to claim 4, wherein a frequency adjusting capacitor is provided between the mount electrode and the ground potential, and
the frequency adjusting capacitor is configured of the insulating film, the capacitor electrode, and the semiconductor substrate.

6. The vibrator device according to claim 3, wherein a decoupling capacitor is provided between the power supply potential and the ground potential, and
the decoupling capacitor is configured of the insulating film, the capacitor electrode, and the semiconductor substrate.

7. The vibrator device according to claim 6, wherein the semiconductor having a first surface that faces the vibrator element, and
the insulating film is provided over the first surface.

8. The vibrator device according to claim 6, wherein the semiconductor having a first surface that faces the vibrator element and a second surface that is opposite to the first surface, and
the insulating film is provided over the second surface.

9. The vibrator device according to claim 1, wherein the circuit includes a circuit that drives the vibrator element.

10. An electronic apparatus comprising the vibrator device according to claim 1.

11. A vehicle comprising the vibrator device according to claim 1.

12. A method of manufacturing a vibrator device comprising:
placing a vibrator element on an IC substrate including a semiconductor substrate configured of a semiconductor having a first conductive type and a circuit, the first conductive type being any one of an N-type and a P-type, electrically coupling the circuit to the vibrator element, overlaying a lid configured of a semiconductor having the first conductive type with the IC substrate to cover the vibrator element; and directly bonding the lid and the semiconductor substrate, wherein the IC substrate includes a mount electrode electrically coupled to the vibrator element, an insulating film provided over a surface of the semiconductor substrate, and a capacitor electrode provided at an opposite side of the insulating film from the semiconductor substrate and having an area larger than the area of the mount electrode.

\* \* \* \* \*